July 17, 1962
A. J. CORNISH
3,045,057
THERMOELECTRIC MATERIAL
Filed Feb. 26, 1960
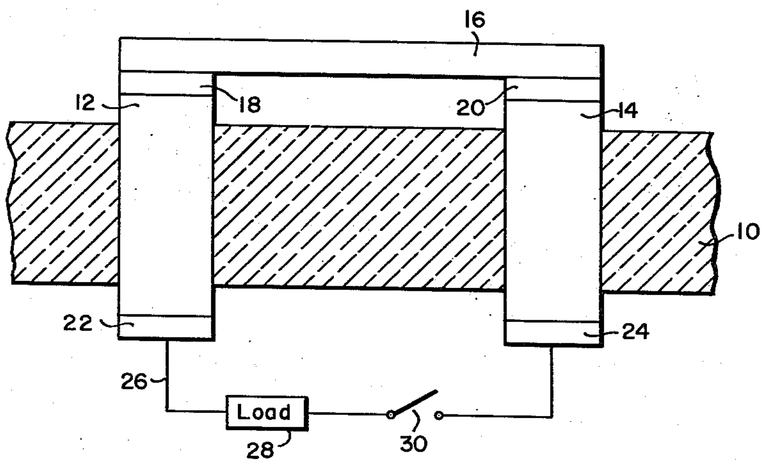
WITNESSES
Edwin E. Bassler
Charles L. Menzemer
INVENTOR
Albert J. Cornish
BY
Frederick Shapoe
ATTORNEY

3,045,057
THERMOELECTRIC MATERIAL

Albert J. Cornish, Pittsburgh, Pa., assignor to Westinghouse Electric Corporation, East Pittsburgh, Pa., a corporation of Pennsylvania Filed Feb. 26, 1960, Ser. No. 11,330
3 Claims. (Cl. 136—5)

The present invention relates generally to thermoelements and particularly to thermoelements comprised of tin telluride and thermoelectric devices embodying the same.

It has been regarded as highly desirable to produce thermoelectric devices wherein either an electric current is passed therethrough to effect cooling at one junction, whereby, to provide for cooling applications, or alternatively, a source of heat is applied to one junction of a thermoelectric device to bring this junction to a given elevated temperature, while the other junction of the device is kept at a low temperature, whereby, an electrical voltage is generated in the device. For refrigeration or cooling applications in particular, one junction of the thermoelectric device is disposed within an insulated chamber and an electrical current is passed through the junction in such a direction that the junction within the chamber becomes cooler while the other junction of the thermoelectric device is disposed externally of the chamber and dissipates heat to a suitable heat sink such as the atmosphere, cooling water or the like.

When heat is applied at one junction of the thermoelectric device while the other junction is cooled, an electrical potential is produced proportional to the thermoelectric power of the thermoelements employed, and the temperature difference between the junctions. Accordingly, it is desirable that the thermoelements be made of such material that, all other factors being equal, the highest potential is developed for a given temperature difference between the hot and cold junctions. The electrical resistivity of the thermoelement member of the device and the thermal conductivity both should be as low as possible in order to reduce electrical losses and thermal losses thereby increasing the overall efficiency.

Thermoelectric devices may be tested and a number indicating its relative effectiveness, called the index of efficiency, may be computed from the test data. The higher the index of efficiency, the more efficient is the thermoelectric material. The index of efficiency, denoted as Z, is defined by:

$$Z=\frac{\alpha 2}{pK}$$

wherein:

$\alpha$=Seebeck coefficient in volts/° K.
p=electrical resistivity in ohm-cm.
K=thermal conductivity in watts/° K.

An object of the present invention is to provide a thermoelectric element comprised of tin telluride.

Another object of the present invention is to provide a thermoelectric device comprising at least one p-type thermoelectric element comprised of a body of material comprising tin telluride doped with a small amount at least one element selected from the group consisting of indium, cadmium, gallium, iron, germanium, zinc, bismuth, antimony, lead, selenium, arsenic and sulfur.

Still another object of the present invention is to provide a thermoelectric device comprising at least one p-type thermoelectric element comprised of a body of material having the formula $A_xSn_{1-x}Te_{1-y}B_y$, wherein A is at least one element selected from the group consisting of indium, cadmium, gallium, iron, germanium, zinc, bismuth, antimony, and lead; and B is at least one element selected from the group consisting of selenium, arsenic and sulfur; and $x$ and $y$ may vary from 0 to 0.2.

Other objects of the present invention will, in part, appear hereinafter and will, in part, be obvious.

For a better understanding of the nature and objects of the invention, reference should be had to the following detailed description and drawing, the single figure of which is a side view, partially in cross section, of a thermoelectric power generator.

In accordance with the present invention an attainment of the foregoing objects, there is provided a thermoelectric device comprising at least one p-type thermoelectric element comprised of a body of tin telluride electrically connected to at least one suitable n-type element. The p-type thermoelectric element may comprise either stoichiometric tin telluride or the tin and/or tellurium component may vary ±5 mol percent from stoichiometric balance without adversely affecting the thermoelectric properties of the material. In addition, the thermoelectric properties of the tin telluride may be markedly improved by doping with at least one element selected from the group consisting of indium, cadmium, gallium, iron, germanium, zinc, bismuth, antimony, lead, selenium, arsenic and sulfur. More generally, the thermoelectric materials of this invention have the formula $$A_xSn_{1-x}Te_{1-y}B_y$$

wherein A is at least one element selected from the group consisting of indium, cadmium, gallium, iron, germanium, zinc, bismuth, antimony, and lead, and B is at least one element selected from the group consisting of selenium, arsenic and sulfur, and $x$ and $y$ may vary from 0 to 0.2.

It is believed that when at least one of the doping agents selected from the group consisting of indium, cadmium, gallium, iron, germanium, zinc, bismuth, antimony and lead are added to the tin telluride they replace a part of the tin. It is also believed that when at least one of the doping agents selected from the group consisting of selenium, arsenic and sulfur are added to the tin telluride they replace part of the tellurium. It is definitely known, however that when the materials are added in predetermined quantities to form a composition having the formula $A_xSn_{1-x}Te_{1-y}B_y$ wherein A is at least one material selected from the group consisting of indium, cadmium, gallium, iron, germanium, zinc, bismuth, antimony and lead; B is at least one material selected from the group consisting of selenium, arsenic and sulfur; and $x$ and $y$ each vary from 0 to 0.2, a very good p-type thermoelectric materials is produced.

Any of the thermoelectric tin telluride material of this invention has a simple cubic NaCl structure and a melting point of approximately 790° C.

The thermoelement of opposite electrical sign (n-type), which may be used in combination with the material of this invention may be comprised of a metal, for example, copper, silver, and mixtures of alloys thereof and negative thermoelectric materials, for example, indium arsenide, indium antimonide, antimony telluride, and mixtures thereof. Since a thermoelement comprising the tin telluride material of this invention is most efficient thermoelectrically when operating at a temperature in the range of approximately 300° C. to 790° C., it will be appreciated that the negative thermoelement material also must function well and be chemically and thermally stable within this temperature range.

The p-type thermoelectric material of this invention having the formula $A_xSn_{1-x}Te_{1-y}B_y$ may be produced and used in the polycrystalline form or as a single crystal. The material of this invention may be prepared in accordance with the Bridgmann processes as well as by similar processes known to those skilled in the art. The material of this invention having the formula $$A_xSn_{1-x}Te_{1-y}B_y$$

may also be produced by the hot pressing powder metallurgy technique set forth in U.S. patent application Serial No. 11,673, filed February 29, 1960, the assignee of which is the same as that of the present invention. If a polycrystalline material is desired, predetermined portions of tin, tellurium and any of the specified doping materials desired to form the compound having the equation $$A_xSn_{1-x}Te_{1-y}B_y$$

are charged into a vessel or bulb of quartz or other inert material that will not react with the melt of the material. The vessel or bulb is then evacuated and sealed off under a vacuum of approximately $10^{-4}$ mm. Hg. The vessel is then placed in a horizontal tube furnace and heated to a temperature in excess of 800° C., preferably a temperature of approximately 810° C., at which temperature the entire mixture becomes molten. The vessel is agitated to insure complete mixing during the melting period, and then allowed to cool to room temperature. If desired, the molten alloy may be cooled more rapidly by quenching in water or other cooling medium.

If single crystal material is desired, the quartz bulb is removed from the first furnace after solidification and suspended in the top zone of a vertical tube furnace having two heating zones. The top zone of the heating furnace is maintained at a temperature of at least 800° C., preferably of about 850° C. The bottom zone of the furnace is maintained at a temperature below 790° C., preferably approximately 750° C. The vessel is then slowly lowered through the top zone of the furnace to the bottom zone. Satisfactory results have been achieved when using a furnace having a top zone of 12 inches in length and a cooler bottom zone of 12 inches in length when the vessel is lowered at the rate of from approximately ⅜ inch to 2 inches per hour. After the vessel reaches the approximate center of the bottom zone of the furnace, it is allowed to remain at a temperature of approximately 750° C. for several hours and then allowed to cool to room temperature.

The following examples illustrate the practice of this invention.

EXAMPLE I

A homogeneous admixture comprised of 23.6 grams of tin and 25.4 grams of tellurium was charged into a quartz bulb having an inside diameter of ⅝ inch. The bulb was evacuated and sealed off under a vacuum of $10^{-4}$ mm. Hg. The bulb was then placed in a furnace and heated to 810° C. at which temperature the mixture became molten. The bulb was agitated to insure thorough mixing during the heating step, and then allowed to cool to room temperature, approximately 25° C.

The solidified stoichiometric tin telluride was removed from the quartz bulb and its electrical and thermal properties determined. The electrical and thermal properties and the thermoelectric figure of merit determined from these properties is set forth in the table below.

EXAMPLE II 0.1068 gram indium, 5.4118 grams of tin and 5.9363 grams of tellurium were admixed and in accordance with the procedure set forth in Example I were admixed in the molten state to produce a compound having the formula $In_{.02}Sn_{.98}Te$. The electrical and thermal properties of the indium doped tin telluride were determined and, together with the thermoelectric figure of merit determined from these values are set forth in tabular form below.

EXAMPLE III

An admixture of 1.12 grams of cadmium, 22.5 grams tin and 25.4 grams of tellurium were charged into a quartz bulb having an inside diameter of ⅝ inch. The bulb was evacuated and sealed off under a vacuum of $10^{-4}$ mm. Hg. The bulb was then placed in a furnace and heated to 850° C. at which temperature the mixture became molten. The bulb was agitated to insure thorough mixing during the heating step, and then allowed to cool to room temperature (approximately 25° C.). The bulb was then suspended at the top zone of a vertical tube furnace having two heating zones. The top zone of the furnace was 12 inches long and the bottom heating zone was 12 inches long. The bulb was suspended at approximately the midpoint of the top heating zone of the furnace which was maintained at a temperature of 850° C., and the bulb was allowed to descend through the top zone at a rate of approximately 1 inch per hour. Upon descending from the top zone, the bulb entered the lower heating zone which was maintained at a temperature of approximately 750° C. The bulb was allowed to pass through approximately one half (6 inches) of the lower heating zone and then stopped in descent and maintained at a temperature of 750° C. for approximately 8 hours.

The resultant single crystal material had the formula $Cd_{.05}Sn_{.95}Te$. The electrical and thermal properties of the material were determined and are set forth together with the thermoelectric figure of merit determined therefrom in tabular form below.

EXAMPLE IV 0.679 gram of gallium, 22.5 grams of tin and 25.4 grams of tellurium were reacted in accordance with the procedure of Example III to form a single crystal of the compound having the formula $Ga_{.05}Sn_{.95}Te$. The electrical and thermal properties of the compound were determined and are set forth together with the thermoelectric figure of merit determined therefrom in tabular form below.

EXAMPLE V 1.25 grams of bismuth, 23.02 grams of tin and 25.4 grams of tellurium were reacted in accordance with the procedure of Example III to produce a single crystal body of thermoelectric composition having the formula $$Bi_{.03}Sn_{.97}Te$$

The electrical and thermal properties of the composition were determined and are set forth together with the thermoelectric figure of merit determined therefrom in tabular form below.

EXAMPLE VI 23.74 grams of tin, 25.01 grams of tellurium and 0.29 gram of arsenic were reacted in accordance with the procedure set forth in Example III to provide a single crystal body of thermoelectric composition having the formula $SnTe_{.98}As_{.02}$. The electrical and thermal properties of the composition were determined and are set forth in tabular form below together with the thermoelectric figure of merit determined therefrom.

EXAMPLE VII 23.74 grams of tin, 22.96 grams of tellurium and 1.57 grams of selenium were reacted together in accordance with the procedure of Example III to produce a single crystal body of thermoelectric composition having the formula $SnTe_{.9}Se_{.1}$. The electrical and thermoelectric properties of the composition were determined and are set forth together with the thermoelectric figure of merit determined therefrom in tabular form below.

EXAMPLE VIII 23.74 grams of tin, 22.96 grams of tellurium and 0.64 gram of sulfur were reacted together in accordance with the procedure of Example III to produce a single crystal body of thermoelectric composition having the formula $SnTe_{.9}S_{.1}$. The electrical and thermal properties of the composition were determined and are set forth in tabular form below together with the thermoelectric figure of merit determined therefrom.

*Table*

| Composition | $\alpha$ ($\mu$v./° K.) | p (ohm-cm.) | K (watts/cm.° K.) | Z $\frac{(\alpha 2)}{pK}$ |
|---|---|---|---|---|
| SnTe | 100 | $6\times10^{-4}$ | .028 | $.6\times10^{-3}$ |
| $In_{.02}Sn_{.98}Te$ | 140 | $7.5\times10^{-4}$ | .024 | $.93\times10^{-3}$ |
| $Cd_{.05}Sn_{.95}Te$ | 160 | $15\times10^{-4}$ | .024 | $.61\times10^{-3}$ |
| $Ga_{.05}Sn_{.95}Te$ | 120 | $20\times10^{-4}$ | .024 | $.3\times10^{-3}$ |
| $Bi_{.03}Sn_{.97}Te$ | 145 | $15\times10^{-4}$ | .020 | $.7\times10^{-3}$ |
| $SnTe_{.98}As_{.02}$ | 100 | $7\times10^{-4}$ | .020 | $.7\times10^{-3}$ |
| $SnTe_{.9}Se_{.1}$ | 140 | $12\times10^{-4}$ | .020 | $.8\times10^{-3}$ |
| $SnTe_{.9}S_{.1}$ | 130 | $15\times10^{-4}$ | .020 | $.6\times10^{-3}$ |

Referring to the figure of the drawing, there is illustrated a thermoelectric device suitable for producing electrical current from heat. The thermally insulating wall 10 so formed as to provide a suitable furnace chamber is perforated to permit the passage therethrough of a positive thermoelement 12 having the formula $A_xSn_{1-x}Te_{1-y}B_y$ wherein A, B, $x$ and $y$ have the values set forth above, and a negative thermoelement member 14 such as for example indium arsenide. An electrically conducting strip of metal 16, for example, copper, silver, or the like, is joined to the end base 18 of the member 12 and end face 20 of the member 14 within the chamber so as to provide good electrical and thermal contact therewith. The end faces 18 and 20 may be coated with a thin layer of metal, for example, by vacuum evaporation or by use of ultrasonic rays whereby good electrical contact is obtained. The metal strip 16 of copper, silver or the like may be brazed or soldered or otherwise joined to the metal coated faces 18 and 20. The metal strip 16 may be provided with suitable fins or other means for conducting heat thereto from the furnace chamber in which it is disposed.

At the end of member 12, located on the other side of the wall 10, is attached a metal plate or strip 22 by brazing or soldering in the same manner as was employed in attaching strip 16 to the end face 18. Similarly, a metal strip or plate 24 may be connected to the other end of member 14. The plates 22 and 24 may be provided with heat dissipating fins or other cooling means whereby heat conducted thereto may be dissipated. The surface of the plates 22 and 24 may also be cooled by passing a current of a fluid such as water or air across their surfaces. An electrical conductor 26 containing a load 28 is electrically connected to the end plates 22 and 24. A switch 30 is interposed in the conductor 26 to enable the electrical circuit to be open and closed as desired. When the switch 30 is moved to the closed position an electrical current flows between members 12 and 14 and energizes the load 28.

It will be appreciated that a plurality of pairs of the positive and negative members may be joined in series or in parallel in order to produce a plurality of cooperating thermoelements. In a similar manner, each of the thermoelements may be disposed with one junction in a furnace or exposed to any other source of heat or the other junction is cooled by applying water or blowing air or other cooling medium thereon or the like. Due to the relative difference in temperature of the junctions, an electrical voltage will be generated in the thermoelements. By joining in series a plurality of the thermoelements, direct current of any suitable voltage may be generated.

While the element 12 has been shown to be comprised completely of a composition having the formula $$A_xSn_{1-x}Te_{1-y}B_y$$

it will be understood that the material may comprise only a portion of the element, the remaining portion or portions being comprised of one or more other materials of the same thermoelectric sign.

It will be appreciated that the above description and drawing are only exemplary and not exhaustive of the invention.

I claim as my invention:

1. A thermoelectric device comprising at least one p-type thermoelectric element comprised of a composition having the formula $SnTe_{1-y}Se_y$ wherein $y$ is greater than zero and less than 1.

2. A thermoelectric device comprising at least one p-type thermoelectric element comprised of a composition having the formula $In_{.02}Sn_{.98}Te$.

3. A thermoelectric device comprising at least one p-type thermoelectric element comprised of a composition having the formula $SnTe_{.9}Se_{.1}$.

References Cited in the file of this patent

UNITED STATES PATENTS 2,898,743 Bradley ---------------- Aug. 11, 1959

OTHER REFERENCES

Mariguchi et al.: J. Phys. Soc., Japan, vol. 12, page 100, 1957.

Hashimoto et al.: J. Phys. Soc., Japan, vol. 11, pages 716–717, 1956.